(12) United States Patent
Sadra et al.

(10) Patent No.: US 7,132,340 B2
(45) Date of Patent: Nov. 7, 2006

(54) APPLICATION OF POST-PATTERN RESIST TRIM FOR REDUCING POCKET-SHADOWING IN SRAMS

(75) Inventors: Kayvan Sadra, Addison, TX (US); Theodore W. Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/018,602

(22) Filed: Dec. 21, 2004

(65) Prior Publication Data

US 2006/0134889 A1 Jun. 22, 2006

(51) Int. Cl.
*H01L 21/8238* (2006.01)
*H01L 21/336* (2006.01)

(52) U.S. Cl. .................. 438/302; 438/232; 438/231

(58) Field of Classification Search ............. 438/232, 438/231, 302, 230, 262, 279, 694, 197; 257/E21.346, 257/E21.538, E21.662, E21.621
See application file for complete search history.

(56) References Cited

U.S. PATENT DOCUMENTS

| | | | |
|---|---|---|---|
| 6,569,606 B1 * | 5/2003 | Wu et al. ............... | 438/302 |
| 6,642,148 B1 | 11/2003 | Ghandchari et al. | |
| 6,762,459 B1 | 7/2004 | Choi et al. | |
| 2003/0203550 A1 * | 10/2003 | Lai et al. ............... | 438/199 |
| 2005/0167397 A1 * | 8/2005 | Chen et al. ............... | 216/59 |

\* cited by examiner

*Primary Examiner*—Walter Lindsay, Jr.
(74) *Attorney, Agent, or Firm*—Peter K. McLarty; W. James Brady, III; Frederick J. Telecky, Jr.

(57) ABSTRACT

Methods (600, 700) are disclosed for minimizing the effect of pocket shadowing in the fabrication of an angled pocket implant (32) extending underlying a gate region (21) of a transistor (10), particularly in SRAM devices (400). The pocket shadowing is minimized by initially forming a relatively thick resist layer (810) overlying the semiconductor device (800), then the resist layer thickness (810*y*) is reduced (trimmed) to a reduced thickness (860*y*) by using a subsequent post-development dry or wet resist-reduction etch process (630, 730). The etch process (630, 730) also increases corner rounding (860*r*), thereby reducing pocket shadowing of the angled implant from nearby features or the resist (228, 328, 860). The pocket shadow reduction may be accomplished by first forming (610, 710) the relatively thick resist layer (810) overlying the semiconductor device (400, 800). The resist layer (860) is then wet and/or dry etched (630, 730) to trim the resist thickness (860*y*) and to round the corners (860*r*) of the resist (442, 860). In combination, these changes reduce shadowing of angled implants from nearby structures and resist edges. The method may further comprise a first implant (720) (e.g., an LDD implant) before the resist etch trim (730), and a second angled pocket implant (740) after the etch trim (730) to permit individually optimizing the resist thickness and CD for each implant. Thus, only one lithography step is required, while cross diffusion of the LDD implant is mitigated. Transistors (443 and 446, 448, or 830 and 840) formed in this manner may yield improved performance when incorporated into SRAM (400, 800) since the probability that such transistors will be more closely matched is increased.

17 Claims, 8 Drawing Sheets

Section A-A

Section A-A

APPLICATION OF POST-PATTERN RESIST TRIM FOR REDUCING POCKET-SHADOWING IN SRAMS

FIELD OF INVENTION

The present invention relates generally to semiconductor processing, and more particularly to fabricating a transistor in a manner that reduces shadowing of pocket implantations and thereby facilitates improved performance and stability, particularly when utilized in static random access memory (SRAM).

BACKGROUND OF THE INVENTION

Several trends presently exist in the semiconductor and electronics industry. Devices are continually being made smaller, faster and requiring less power. One reason for these trends is that more personal devices are being fabricated that are relatively small and portable, thereby relying on a battery as their primary supply. For example, cellular phones, personal computing devices, and personal sound systems are devices that are in great demand in the consumer market. In addition to being smaller and more portable, personal devices are also requiring increased memory and more computational power and speed. In light of all these trends, there is an ever increasing demand in the industry for smaller and faster transistors used to provide the core functionality of the integrated circuits used in these devices.

Accordingly, in the semiconductor industry there is a continuing trend toward manufacturing integrated circuits (ICs) with higher densities. To achieve high densities, there has been and continues to be efforts toward scaling down dimensions (e.g., at submicron levels) on semiconductor wafers, that are generally produced from bulk silicon. In order to accomplish such high densities, smaller feature sizes, smaller separations between features, and more precise feature shapes are required in integrated circuits fabricated on small rectangular portions of the wafer, commonly known as dies. This may include the width and spacing of interconnecting lines, spacing and diameter of contact holes, as well as the surface geometry of various other features (e.g., corners and edges). The scaling-down of integrated circuit dimensions can facilitate faster circuit performance and/or switching speeds, and can lead to higher effective yield in IC fabrication by providing more circuits on a die and/or more die per semiconductor wafer.

The process of manufacturing integrated circuits typically consists of many steps, during which hundreds or thousands of copies of an integrated circuit can be formed on a single wafer. This process can create electrically active regions in and on the semiconductor wafer surface. In MOS transistors, for example, a gate structure containing conductive material (s) is created, that can be energized to establish an electric field within a semiconductor channel, by which current is enabled to flow through the channel defined under the gate structure and between a source and drain region within the transistor. The source and drain regions and/or an upper portion of the gate structure facilitate this conductance by virtue of containing a majority of positively charged (p) or negatively charged (n) dopant materials. Adjusting the voltage applied to the gate changes the amount of current flowing through the channel. A gate electrode of the gate structure is separated from the channel by a gate dielectric, which is an insulator and which opposes current flow between the gate electrode and channel, such that the device does not conduct current until a sufficient voltage (at least as large as a threshold voltage $V_t$) is applied to the gate electrode.

Dopant atoms are implanted into the source and drain regions to establish the n or p type regions. In semiconductor processing, a patterned resist layer is used to mask or guide the implantation of the dopant atoms to the underlying layers to establish source, drain, and other such areas of the semiconductor device. Because such patterning tools are very expensive and usually limit the throughput of a factory, minimal patterning steps and sharing a pattern for multiple operations is desirable to minimize manufacturing costs.

As semiconductor features are aggressively reduced, however, sharing a pattern for multiple usages presents increased problems that limit the usable feature size. One such problem is that the positions of the resist edges that may work best for one or more implants are not the best positions for other implants.

One type of implant is the "pocket implant" or "halo implant" that includes implanting a dopant species at an angle (relative to a normal angle perpendicular to the surface) extending under a portion of the gate region of a transistor. The pocket implant may improve the performance of a transistor by providing a means to scale the channel length and increase the transistor drive current without causing an increase in the off-state leakage current. Because the pocket implant is tilted at an angle, a nearby device or resist layer edge may shadow part of the exposed transistor area, preventing some dopant atoms from entering the substrate with their original energy or from reaching the substrate at all. This phenomenon is referred to as "pocket shadowing" or "pocket blocking". Such a reduced dosage of the intended pocket species in the transistor will result in undesirable deviations of the electrical characteristics of the transistor, such as a lower threshold voltage than that originally designed for the transistor.

Pocket shadowing issues may persist or increase with the shrinking of semiconductor devices, and associated disadvantageous effects resulting therefrom may become more prevalent as transistor widths and lengths are reduced. In general, the problems of pocket shadowing refer to the differences in the amount of dopant atoms received within certain areas (e.g., source/drain regions) as those areas are reduced in size. For example, shadowing ends up reducing the Vt of a transistor to less than its desired value. In addition, in situations where there is misalignment, a right transistor Vt may be altered more or less than a left transistor Vt, thereby disadvantageously creating transistor mismatch. It can be appreciated that the effects of pocket shadowing may be even more noticeable in certain types of semiconductor devices, such as static random access memory (SRAM), for example, which incorporate multiple densely packed transistors that require matched electrical properties.

Semiconductor memories can, for example, be characterized as volatile random access memories (RAMs) or non-volatile read only memories (ROMs), where RAMs can either be static (SRAM) or dynamic (DRAM) differing mainly in the manner by which they store a state of a bit. In SRAM, for example, each memory cell includes transistor-based circuitry that implements a bistable latch, which relies on transistor gain and positive (e.g., reinforcing) feedback so that it can only assume one of two possible states, namely on (state 1) or off (state 2). The latch can only be programmed or induced to change from one state to the other through the application of a voltage or other external stimuli. This arrangement is desirable for a memory cell since a state written to the cell will be retained until the cell is reprogrammed. DRAMs on the other hand implement a capacitor that is either charged or discharged to store the on (state 1) or off (state 2) state of a cell. Capacitors discharge over time, however, and DRAMs must therefore be periodically 'refreshed'. Also, a bistable latch can generally be switched between states much faster than the amount of time it takes to charge or discharge a capacitor. Accordingly, SRAMs are a desirable type of memory for certain types of applications.

SRAM is typically arranged as a matrix of memory cells fabricated in an integrated circuit chip, and address decoding in the chip allows access to each cell for read/write functions. SRAM memory cells use active feedback from cross-coupled inverters in the form of a latch to store or "latch" a bit of information. These SRAM memory cells are often arranged in rows so that blocks of data such as words or bytes can be written or read simultaneously. Standard SRAM memory cells have many variations. The basic CMOS SRAM cell generally includes two n-type (nMOS) pull-down or drive transistors and two p-type (pMOS) load transistors in a cross-coupled inverter configuration, with two additional nMOS select transistors added to make up a six-transistor cell (a 6T cell). Additionally, application specific SRAM cells can include an even greater number of transistors. Since a plurality of transistors are utilized in SRAM requiring matched electrical characteristics, and since pocket shadowing may become more prevalent as transistor widths are reduced, the adverse effects of pocket shadowing may present themselves to a great degree in SRAM, particularly as that type of memory is continually scaled down.

Accordingly, it would be desirable to obtain a technique that would allow transistors to be scaled down while mitigating pocket shadowing, particularly where the transistors may be used in SRAM devices.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention is directed to a resist reduction process that reduces shadowing associated with angled implants.

The present invention in one aspect pertains to forming a pocket implant or halo implant extending under a portion of a transistor gate region using an resist etch process which minimizes pocket shadowing where densely packed and/or matched transistors are employed. A thick resist layer (e.g., used for a first implant) is wet and/or dry etched to reduce the thickness of the resist layer to a reduced thickness, to round the corners of the resist, and/or to decrease a critical dimension of the resist (e.g., in SRAM transistors). These changes reduce shadowing from neighboring resist feature edges and increases exposure of the active regions adjacent the gate structure during angled pocket implantation. In the methods of the present invention the resist treatment process follows standard pattern development and precedes the angled pocket implant.

In one aspect of the present invention, the resist treatment is done between a first implant that may comprise a non-angled implant (e.g., an LDD implant) and a second implant that may include an angled implant (e.g., a pocket implant). The first LDD implantation is performed using the original untreated resist pattern (e.g., optimized for the LDD implant). After the resist treatment, the second pocket implant is performed (e.g., optimized by the resist treatment with the corner rounding, trimmed resist thickness and CD loss) to facilitate a reduction in pocket shadowing. In this manner transistors formed in accordance with one or more aspects of the present invention may yield improved performance when incorporated into various circuit applications, for example, SRAM since the probability is increased that such transistors will be more closely matched.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

Figure 1A:
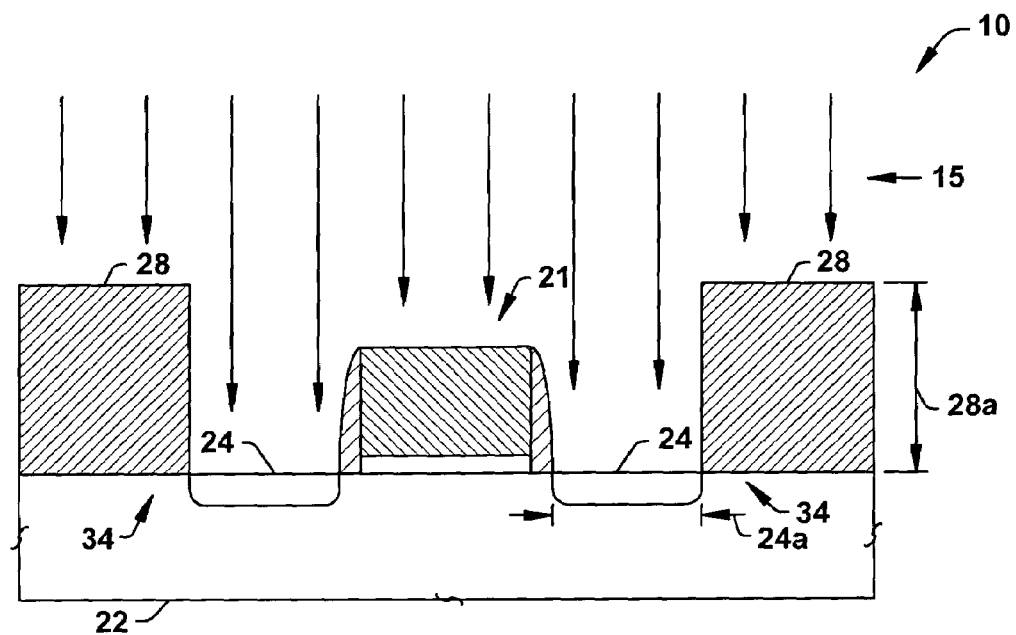
FIGS. 1A and 1B are cross-sectional views illustrating the formation of LDD regions and pocket implant regions within a substrate of a transistor such as may be formed in accordance with the present invention.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present is invention may be practiced with a lesser degree of these specific details. In other instances, known structures and devices are shown in block diagram form in order to facilitate describing one or more aspects of the present invention.

The present invention pertains to decreasing pocket shadowing during angled implantations of a transistor by application of a dry and/or wet etching process to the surface, edges, and corners of a patterned resist layer in the fabrication of semiconductor devices. The resist treatment follows standard pattern development and precedes the angled pocket implant.

In semiconductor processing, there is a desire to minimize costs by using as few patterning steps as possible. This is particularly because patterning tools are very expensive and often limit the throughput of a semiconductor fabrication facility. Therefore, it is advantageous, where possible, to accomplish multiple implantations sharing the same resist pattern while the pattern is still on the wafer. Many such shared patterns exist for facilitating multiple implantations in accordance with the present invention. In each shared pattern, two or more implantation types may be performed with different dopant species, at different implantation energies, angles, or dose rates, for example.

Figure 1B:
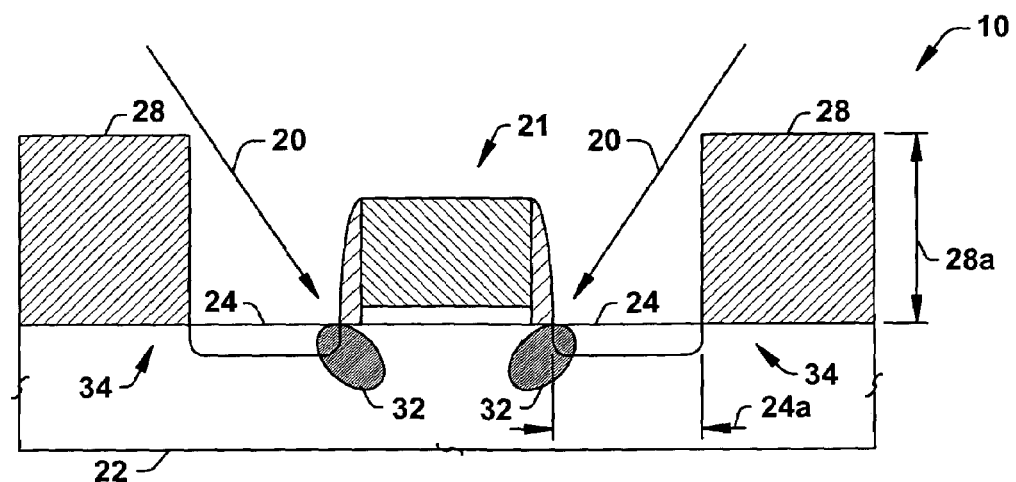

FIGS. 1A and 1B, for example, illustrate the formation of LDD regions and pocket implant regions, respectively, within a substrate of a transistor 10 such as may be formed in accordance with the present invention utilizing the same resist mask pattern. Transistor 10 is shown receiving an LDD implant 15 in FIG. 1A, and an angled pocket implant 20 in FIG. 1B, respectively, where the same resist pattern is utilized for both implants. Transistor 10 comprises a conventional gate structure 21 overlying a semiconductor substrate 22 wherein LDD regions 24 are formed by the LDD implant 15. The LDD regions 24 are formed by implantation 15 of appropriate dopant species atoms through openings in the resist layer 28 having a thickness 28a. The LDD implant 15 is typically implanted substantially perpendicular to the surface of the substrate 22 (at a 0° angle), so an unrestricted LDD region width 24a is available as an opening for the LDD implantation 15.

In the angled pocket implant 20 of FIG. 1B, halos or pocket implants 32 are formed underlying the edge of the gate structure 21 alongside the LDD regions 24. As shown, only a narrow window of direct exposure to the dopant atoms of the angled implant 20 is available over the upper edge of the resist layer 28 and because of the resist thickness 28a required to ensure protection of other neighboring opposite polarity active regions 34 alongside the LDD regions.

Because transistor features are crowding as device integration increases, and the pocket implant is tilted off the perpendicular axis from the wafer surface, a resist layer edge nearby can shadow or otherwise severely narrow the available window for angled pocket implants. This "pocket shadowing" or "pocket blocking" may prevent some dopants from entering the transistor with their original energy or from reaching the transistor entirely. The reduction of the intended pocket dopant species in the transistor will result in undesirable deviations of the electrical characteristics of the transistor, such as a lower threshold voltage compared to that of a full-pocket transistor implantation.

Figure 2:
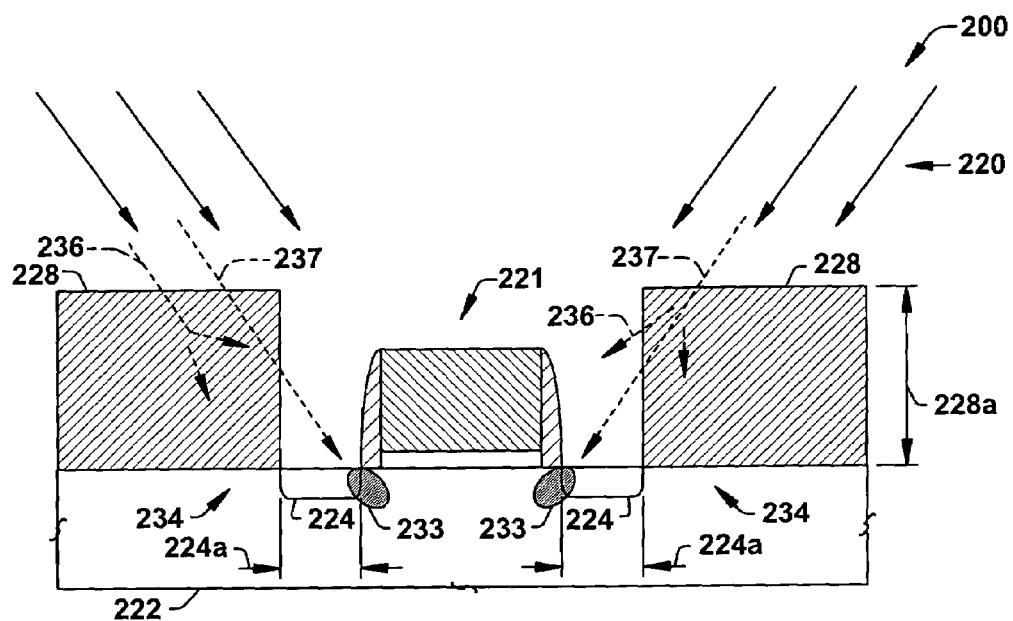
FIGS. 2 and 3 are cross-sectional views illustrating the formation of pocket implant regions within a substrate of a transistor such as may be formed in accordance with the present invention, the transistor having closely spaced resist edges.

FIG. 2, for example, illustrates the problem of pocket shadowing in the formation of pocket implant regions within a substrate of a transistor 200 during pocket implantation 220 where closely spaced resist edges are present. Transistor 200 comprises a conventional gate structure 221 overlying a semiconductor substrate 222. LDD regions 224 are formed by an LDD implant (e.g., similar to LDD implant 15 of FIG. 1A), using appropriate dopant species atoms implanted through openings having a width 224a formed in a resist layer 228 having a thickness 228a. Because of the close feature spacing and the angle of the pocket implant 220, diminished size halos or pocket implants 233 are formed underlying the edge of the gate structure 221 alongside the LDD regions 224 and nearby opposite polarity regions 234.

Typically as the dopant species enter the resist 228, some scatter off the atoms in the resist, thereby losing energy and/or being diverted into various directions off their original path. These scattered ions 236, which have scattered off course will not enter the transistors at the intended locations and will lose energy in such collisions. Ions 237 that have lost energy will also not penetrate the transistor as deeply as intended. Furthermore, if the distance the implant ions travel in the resist is long enough, they may come to a complete stop in the resist and not exit the resist. The degree with which the pocket implant ions are blocked or scattered astray depends on various factors such as the distance they must traverse in the resist (e.g., the resist height, how sharp the top corner is, the distance between the resist and the gate, and the angle of the pocket implant), on the implant species and energy, and on the resist material. In all such cases, the implanted dopant species do not reach their intended locations and a diminished pocket implant 233 may result.

Figure 3:
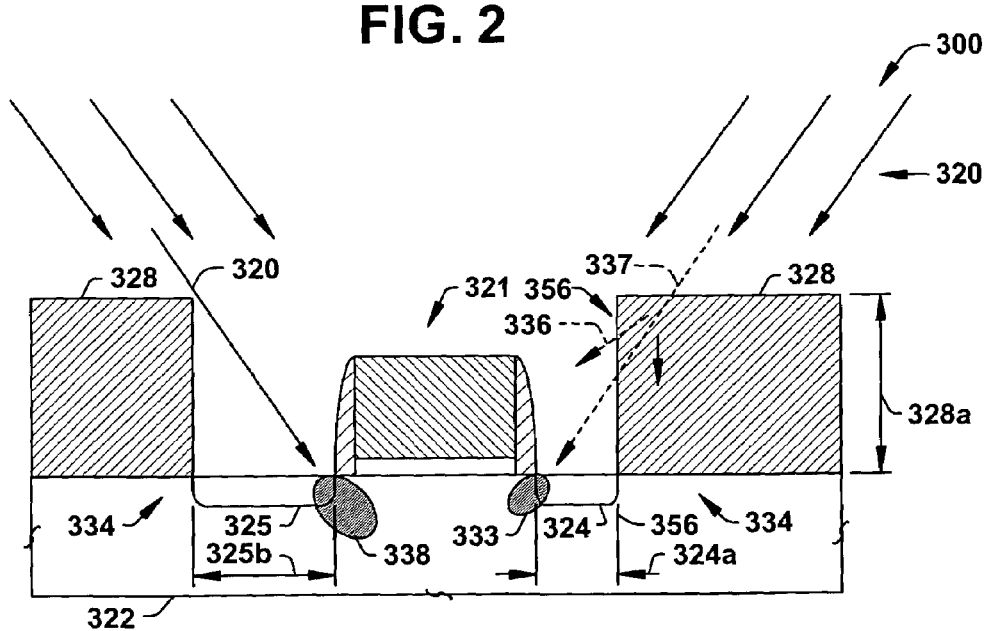

FIG. 3, in another related example, illustrates the problem of pocket shadowing in the formation of pocket implant regions within a substrate of a transistor 300 during pocket implantation 320 where close resist edges are present but they are unequally spaced relative to the gate structure (e.g., due to misalignment during the exposure of the resist). Similar to that of FIG. 2, the transistor 300 of FIG. 3 comprises a conventional gate structure 321 overlying a semiconductor substrate 322. LDD regions 324 are formed by an LDD implant (e.g., similar to LDD implant 15 of FIG. 1A), using appropriate dopant species atoms implanted through openings having a width 324a formed in a resist layer 328 having a thickness 328a. Because of the close feature spacing and the angle of the pocket implant 320, a diminished size halo or pocket implant 333 is formed underlying the edge of the gate structure 321 alongside the LDD region 324 and nearby opposite polarity regions 334. Again, this is because of the scattering of ions 336 or due to ions 337 having diminished energy.

However, where the LDD region 325 may have a larger spacing width 325b relative to gate structure 321, full energy ions from the pocket implant 320 are able to form a full design pocket implant 338 (e.g., similar to 32 of FIG. 1B). This inequality in the electrical design of transistor 300 may produce a variety of undesirable electrical characteristics in addition to those that may be cited hereafter.

In the aforementioned examples and in other cases, as the feature sizes shrink aggressively, sharing the same pattern becomes problematic and may limit the minimum feature size or spacing. Accordingly, the positions of the resist is edges that work best for one or more of the implants are not the best for other implants. Therefore, in these situations, it would be preferable to effect two different resist positions or heights for the two different groups of implants. For example, whereas NLDD implants are usually zero degree implants, pocket implants are angled to introduce the dopants preferentially extending under the edges of the gate, thus forming halos under the edge of the gate.

In some semiconductor devices, all gates are oriented in one direction. In such cases, a pair of pocket implants may be used to introduce dopants under both sides of the gate.

These implants may be referred to as "two rotations", from the use of two 90° rotations of the wafer mounting disc in an ion implanter. The gates of other semiconductor devices may have multiple orientations, wherein four pocket rotations are typically used to implant both sides of all gates substantially equally. Pocket shadowing may occur from any direction, including the directions parallel to the gate or perpendicular to the gate.

In addition to the shadowing problems of closely spaced features from high density integration, "overlay error" due to misalignment and variations in feature dimensions such as the resist critical dimension (CD), the distance between the gate and the resist edge can vary. The smaller this distance, the greater is the effect of pocket shadowing.

Figure 4A:
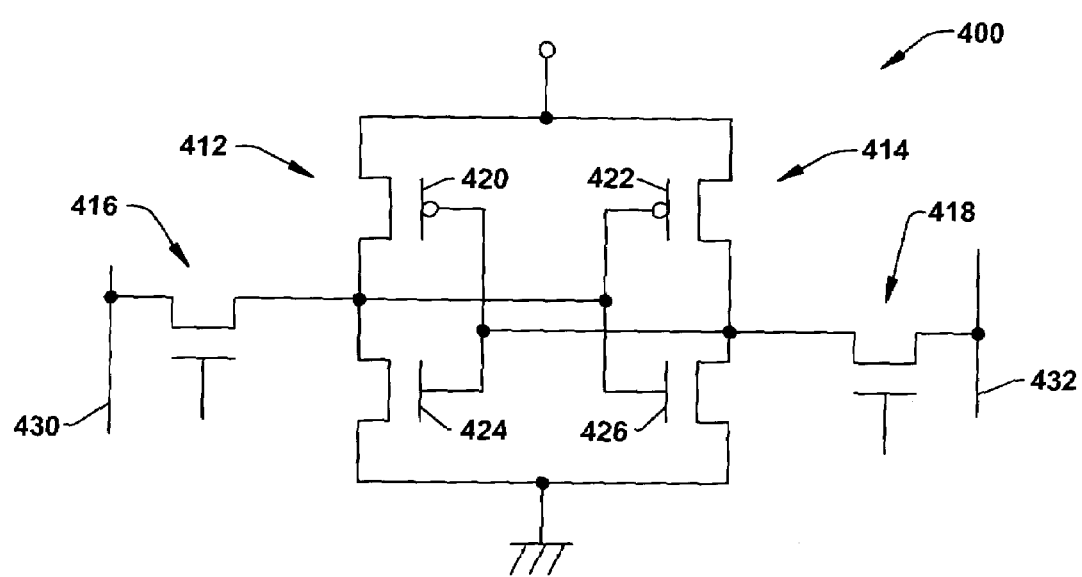
FIG. 4A is a schematic diagram of a conventional static random access memory (SRAM) cell.
Figure 4B:
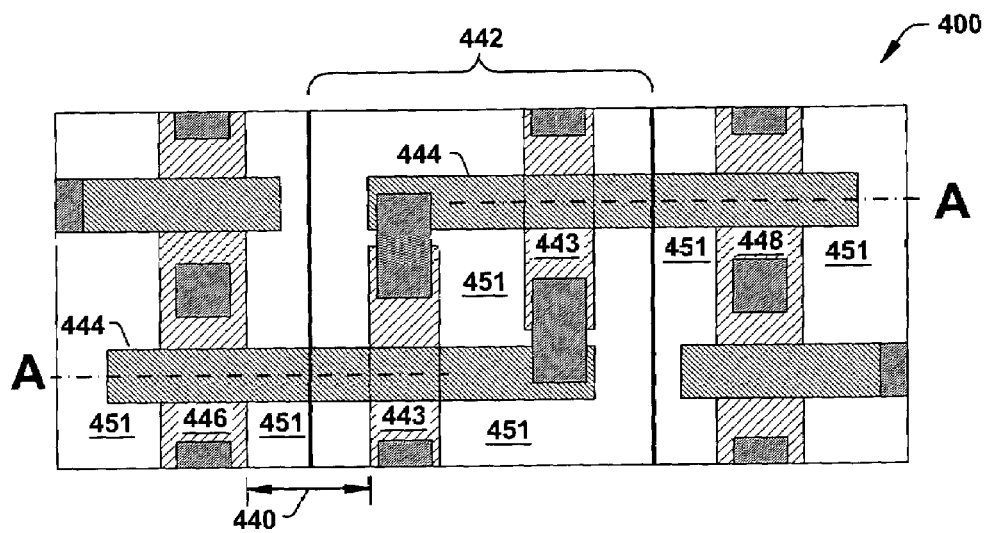
FIGS. 4B–4D are top plan view and corresponding cross-sectional side views illustrating the positional alignment and critical dimension issues relevant to the formation of angled implant regions within a substrate of an SRAM device according to one or more aspects of the present invention.
Figure 4C:
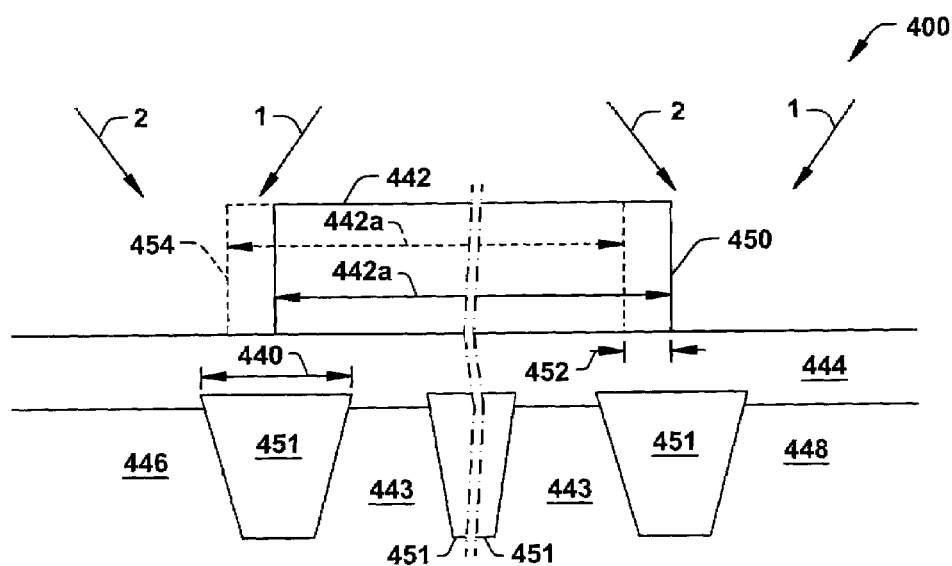
Figure 4D:
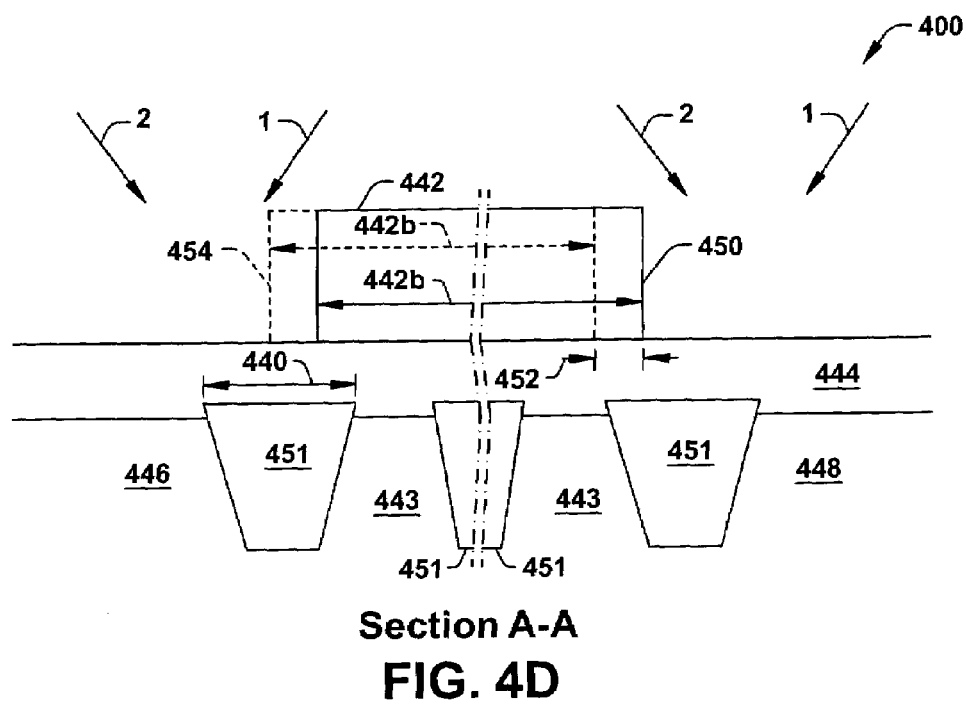

FIGS. 4A, 4B, 4C, and 4D illustrate an exemplary SRAM circuit 400 such as may be used in association with the present invention, and wherein several aspects of the invention are presented. FIG. 4A illustrates the schematic diagram for the SRAM device 400, while FIGS. 4B–4D are top plan and corresponding cross-sectional side views, respectively, illustrating the positional alignment and critical dimension issues relevant to the formation of angled implant regions within a substrate of the SRAM device 400 according to several aspects of the present invention.

FIG. 4A, for example, illustrates a typical static random access memory (SRAM) cell 400. As illustrated, the SRAM cell 400 generally comprises a pair of cross-coupled inverters 412, 414 to store a data bit state and a pair of pass transistors 416, 418 to read and write a data bit between the cross-coupled inverters 412, 414 and bitlines 430, 432. Respective inverters 412, 414 comprise a p-type MOS (pMOS) pull-up or load transistor 420, 422 and an n-type (nMOS) pull-down transistor 424, 426. Transistors 416, 418 are generally n-type as well. This type of SRAM cell comprises six transistors and is termed a 6T full CMOS SRAM cell. When the channels of all the transistors are formed in the single crystal silicon substrate, it is called a single crystalline bulk CMOS 6T SRAM cell. It is also referred to as a planar SRAM cell when all the transistors are made in the same substrate material (e.g., bulk crystalline silicon, SOI, etc.).

In general, SRAM cells are more stable and have better data retention where the respective pMOS (420, 422) and nMOS (424, 426) transistors are matched for the two inverters (412, 414). However, as dimensions are reduced to scale down devices, pocket shadowing can become an issue that adversely affects transistor matching.

In SRAMs, a small cell size is of paramount importance. As a result, it is important to reduce various dimensions in the SRAM cell, including an n+p+ spacing 440, the spacing between nMOS and pMOS transistors (e.g., dictated by the isolation 451). When the nMOS LDD and corresponding pocket implants are being performed, an NLDD resist pattern 442 is used, with the NLDD resist 442 covering the pMOS transistors 443 having poly layer 444, as shown in FIGS. 4B and 4C. Since the n+p+ spacing 440 is small, the edge of the resist 442 is relatively close to the edge of the nMOS active region, thus the margin of protection by the resist 442 is minimal. In this case, the resist 442 may shadow the left nMOS 446 from rotation 1 of a pocket implant. Likewise, the resist 442 may shadow the right nMOS 448 from rotation 2 of a pocket implant. Both right and left nMOS transistors are therefore affected. In a normal alignment position 450 (right side solid line), if the resist height, the shape of its right and left corners, and its distances to the right and nMOS edges are the same, both left and right nMOS transistors, 446 and 448, respectively, will be affected equally. Isolation regions 451 separate nMOS transistor regions (446, 448) from pMOS transistor regions 443. The Dot-dash line in the center of FIGS. 4C and 4D represents a break in the composite A—A cross section.

With misalignment 452, the resist edge, for example in a misaligned position 454 (left side dotted line), will be closer to one nMOS (e.g., left nMOS 446) and farther away from the other (e.g., right nMOS 448). As a result, one nMOS will suffer more pocket shadowing than the other. Not only will pocket shadowing be more severe for the nMOS toward which the resist is misaligned (e.g., left nMOS 446), but also there will be a dopant difference (mismatch) that results between the left and right transistors, which is itself detrimental to SRAM cell 400 performance.

A difference in dopant concentration due to pocket shadowing can, for example, give rise to limited drive current. When the drive current gets limited, the speed at which a memory cell can be accessed may be reduced, for example, and the time it takes to write to the cell may also be somewhat increased. Similarly, pocket shadowing in transistor fabrication can also lead to variations in threshold voltage (Vt). And, as previously mentioned, SRAM that incorporates 'mis-matched' transistors can be adversely affected by operating characteristics that vary from transistor to transistor. For example, such SRAM may be unstable and not retain the desired bit state (e.g., a logic 1 instead of a logic 0 or vice versa).

The application and patterning of the NLDD resist layer 442, provides a critical dimension (CD) width 442a whether in the normal alignment position 450 or in the exemplary misaligned position 454 as shown in FIGS. 4C and 4D. Narrowing the resist width 442a to reduced resist width 442b as shown in FIG. 4D, may offer one solution to minimizing pocket shadowing by increasing implantation exposure to rotation 2 on the right side of resist 442 and to rotation 1 on the left side of resist 442. However, narrowing the resist width 442a must also be limited so as to not to permit LDD cross diffusion into the covered transistor 443, not to uncover the pMOS 443 with maximum misalignment (to avoid nMOS NLDD implantation to enter the pMOS), and not to allow an nMOS pocket implant to reach the pMOS with maximum misalignment through the reduced resist coverage. In views 4C and 4D, it will be appreciated that implantation for the active regions (e.g., 443, 446, and 448) will, in other rotations of the angled implants, be in front of, and behind the poly layer 444.

Another option is to employ a thinner resist initially, however, such an approach suffers from two limitations: (1) there are only discrete values of thickness that have optimum reflectivity in the exposure process and so choices are limited, and (2) the thinner the spun resist, the larger the difference in actual resist thickness over areas of high and low poly density, which exacerbates the tradeoff between blocking implants from active regions of opposite polarity and reducing pocket shadowing.

Figure 5:
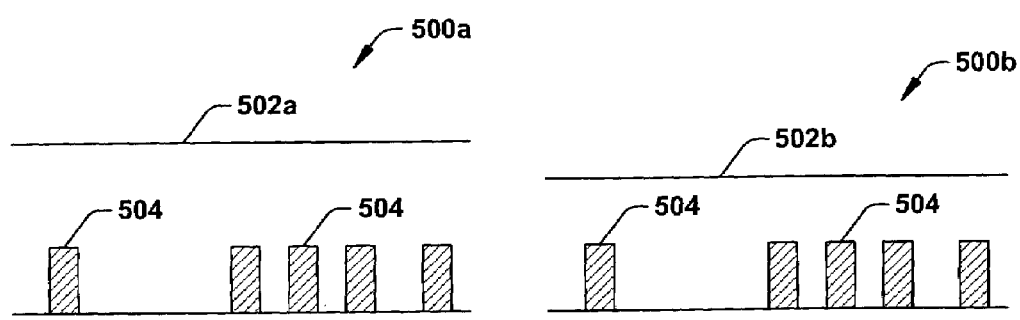
FIG. 5 is a cross-sectional view illustrating a resist layer used overlying gate structures of a transistors before and after a thickness reduction such as may be seen in the method of the present invention.

FIG. 5 illustrates a before 500a and after 500b resist layer thicknesses reductions of a resist layer 502a and 502b overlying gate structures 504 such as may be seen in the method of the present invention to reduce pocket shadowing in the fabrication of memory devices. However, reducing the resist thickness to reduce pocket shadowing must also be moderated to provide a minimum resist thickness that blocks the implant from entering the pMOS 443, provides a thickness value which avoids reflectivity problems, yet maintains a good tradeoff between blocking the implant from entering the pMOS logic where the resist tends to be thinner, and the reducing pocket shadowing in SRAM, where the resist tends to be thicker.

The resist treatment of the present invention reduces shadowing from neighboring resist feature edges and increases exposure of the active regions adjacent the gate structure during subsequent angled pocket implantation. Wet and/or dry etching the resist layer reduces the thickness of the resist layer, to rounds the corners of the resist, and decreases the width of the resist. Transistors fabricated in accordance with one or more aspects of the present invention thus yield improved performance and stability when incorporated into SRAM or other circuits due to the increased likelihood that the transistors will be more closely matched.

Accordingly, turning to FIGS. 6 and 7, methodologies 600 and 700 respectively, are illustrated and hereinafter described for forming a pocket implant, which minimizes pocket shadowing where densely packed and/or matched transistors are employed using an etch resist process. Transistors (e.g., 10 of FIGS. 1A and 1B) formed in accordance with one or more aspects of the present invention may be utilized in a static random access memory (e.g., SRAM 400 of FIGS. 4A–4D) facilitate stability, among other things, within the SRAM. While the methods 600 and 700 are illustrated and described below as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Further, one or more of the acts depicted herein may be carried out in one or more separate acts or phases. Additionally, while the discussion herein is with made within reference to SRAM, it is to be appreciated that one or more aspects of the present invention may have application to different types of memories and/or to other structures or circuits not illustrated or described herein.

Initially at 610, a layer of resist material (e.g., 442 of FIG. 4C) is developed (e.g., resist is applied and patterned) overlying, for example, a polysilicon layer (e.g., 444) and active regions (e.g., 443, 446, 448) and isolation regions (e.g., 451) of a semiconductor device (e.g., an SRAM device 400) in a substrate. At 630 an etch process or resist trim process, comprising a wet and/or a dry etch process, is applied to the resist material layer 442. An exemplary dry process may include a plasma etch process, typically using oxygen as the sole or primary etch agent, with the plasma power adjusted to achieve the desired balance between thickness and width loss. A typical wet process would employ a dissolving solution to remove some of the photoresist.

The resist trim process is utilized to reduce the thickness of the resist, round the corners of the resist, and optionally, to reduce a critical dimension (e.g., the resist width, or another otherwise minimal dimension). Following the resist trim process 630, an angled implant is performed at 640 extending under a portion of the gate region of the transistors to form a pocket implant, for example, in the transistors of an SRAM memory device. Beneficially, while the trim results have little effect on vertical implantations such as the LDD vertical implant 15, all of the changes which result from the resist trim process 630 tend to minimize shadowing during the subsequent angled pocket implant at 640.

Further, the resist trim process of the methods of the present invention may be adjusted to reduce the thickness of the resist to any arbitrary value for optimal reduction in pocket shadowing while maintaining good blocking in other areas and also avoiding non-uniformities in resist thickness between low and high density areas. In one example, the initial resist layer may be made thicker, so that a flat resist surface is achieved before, as well as after the resist trim process. In another beneficial aspect of the present invention, because the initial patterning is done before other steps, the limitation of optimum, or discrete resist thicknesses that are otherwise required for reflectivity considerations is avoided.

Figure 7:
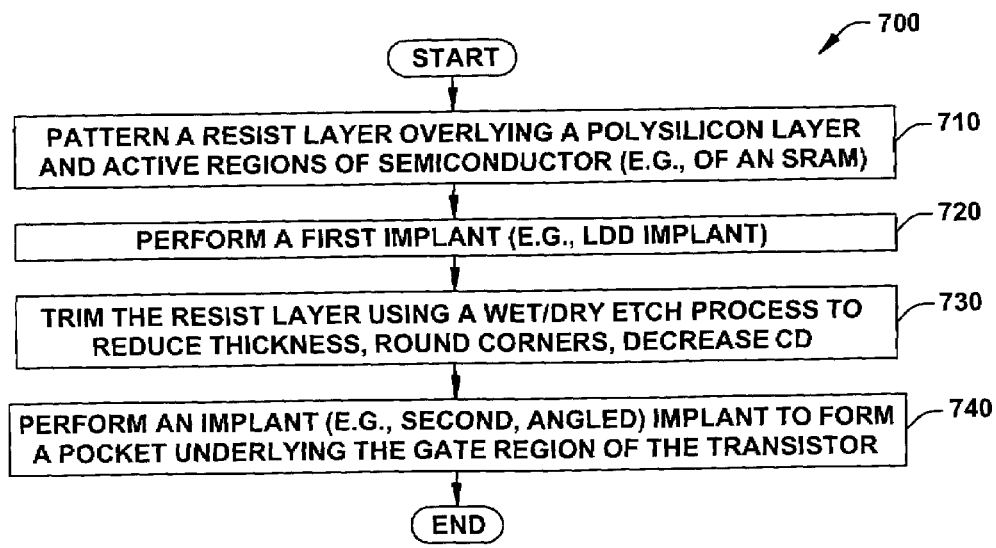

Method 700 of FIG. 7 is similar to that of method 600, with the addition of a first implant (e.g., an LDD implant) between the resist patterning and the resist trim process. This addition to the method permits patterning the resist specifically for the vertical (0° angle) implantations (e.g., LDD implant 15 of FIG. 1A) with the preferred placement of the resist pattern for this implantation. Then, after this first, vertical implant, the resist layer is trimmed by a combination of the wet and/or dry etch process to modify the existing resist pattern on the wafer for angled implantations (e.g., pocket implant 20 of FIG. 1B). In particular, the wet/dry resist trim process of the present invention reduces the resist height, rounds the corners of the resist, and etches back the critical dimensions of the resist edge as needed. Whether dry or wet etch processes are used, process parameters such as chemistry, power, and temperature may be fine-tuned to accomplish various amounts of top surface reduction, corner rounding, or recession of the vertical edge, in order to optimize one or more angled pocket implants.

For example, initially at 710 in method 700 of FIG. 7, a layer of resist material (e.g., 442 of FIG. 4C) is developed (e.g., resist is applied and patterned) overlying a polysilicon layer (e.g., 444) and active regions (e.g., 443, 446, 448) and isolation regions (e.g., 451) of a semiconductor device (e.g., an SRAM device 400) in a substrate. Then, at 720 following pattern development, the resist material layer 442 is utilized for masking a first implantation (e.g., a vertical or 0° angle LDD implantation similar to 15 of FIG. 1A). At 730 an etch process or resist trim process, comprising a wet and/or a dry etch process, is applied to the resist material layer 442. The resist trim process is utilized to reduce the thickness of the resist, round the corners of the resist, and/or reduce a critical dimension (e.g., the resist width, or another otherwise minimal dimension). Following the resist trim process 730, a second implant comprising, for example, an angled implant is performed at 740 extending underlying the gate region of the transistors to form a pocket implant, such as may be used in the transistors of an SRAM memory device. Beneficially, in this method, all of the changes which result from the resist trim process of 730 are utilized to minimize shadowing during the subsequent angled pocket implant at 740, thereby enhancing the matching and other performance improvements of the transistors of the device 400.

Although a wet and/or dry etch process is illustrated and described herein (e.g., 630, 730), it will be appreciated that other such resist removal processes are anticipated to trim the height, width, and corner round the resist to reduce pocket shadowing for angled implantations.

Typically each wet or dry trim process will have some characteristic anisotropy, the ratio of resist loss in the vertical and horizontal directions. This determines how much resist CD (e.g., resist width) is lost compared to how much resist thickness is lost. Wet processes are typically isotropic; meaning CD loss per side is generally equal to thickness loss. Anisotropy of dry processes is typically adjustable within some range. So generally it is expected that there will be some loss of resist CD as the etch trims the thickness. Accordingly, a pattern having a larger CD before the trim process may be used to compensate for an otherwise undesirable CD loss using the trim process.

FIGS. 8–12, for example, illustrate exemplary changes in resist thickness, corner rounding, and various critical dimensions as a result of the resist treatment used in accordance with one or more aspects of the methods (600, 700) of the present invention.

Figure 6:
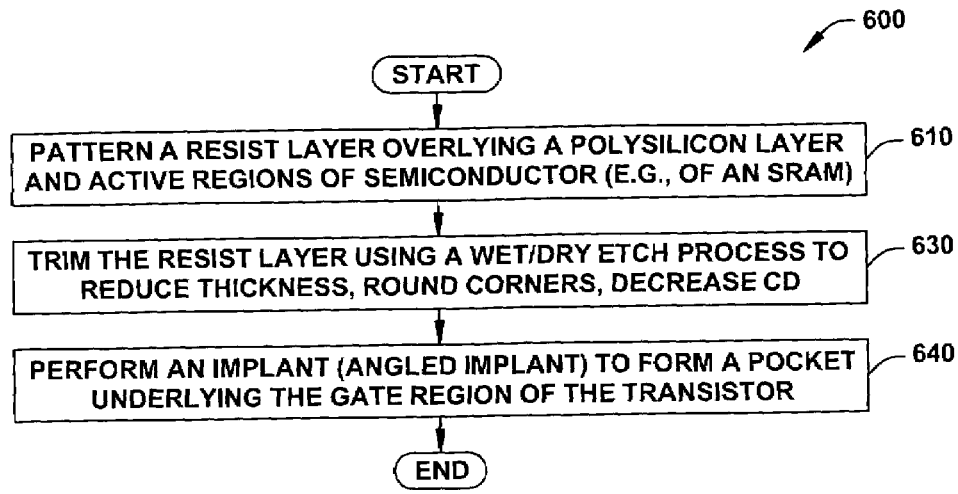
FIGS. 6 and 7 represent flow diagrams illustrating exemplary methods for forming pocket implantations (halo) regions extending under a gate structure having reduced pocket shadowing according to one or more aspects of the present invention.
Figure 8:
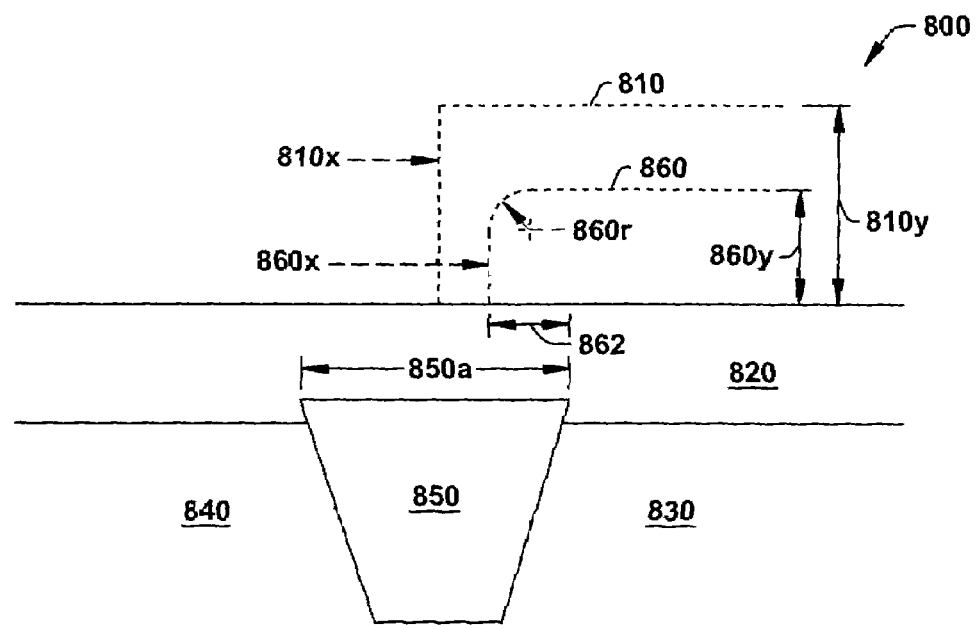
FIGS. 8–12 are cross-sectional views illustrating the changes in resist thickness, corner rounding, and the critical dimension as a result of the resist treatment used in accordance with one or more aspects of the present invention.

FIG. 8 illustrates an exemplary portion of an SRAM or other circuit device 800 similar to that of 400 of FIGS. 4A–4D such as may be used in accordance with the method 600 of FIG. 6. SRAM device comprises an original resist layer 810 having an original resist horizontal (lateral) position 810*x*, and thickness 810*y*. The resist layer 810 is patterned and developed overlying the substrate and poly layer 820, used as part of a gate structure overlying nMOS transistor region 830, and pMOS transistor region 840, which are insulated and separated by isolation structure, for example, STI 850. Isolation structure 850 has an n+p+ spacing width 850*a* between the nMOS and the pMOS regions 830 and 840, respectively. Before the resist trimming process (630, 730), the horizontal position 810*x* of the original resist 810 is, for example, placed by design in the center of the n+p+ spacing width 850*a* of isolation structure STI 850 as shown. Following the resist etch process, resist layer 810 is reduced both vertically and horizontally to a reduced resist layer 860 having a reduced horizontal position 860*x*, and reduced thickness 860*y*.

The new horizontal position 860*x* of the reduced resist layer 860, now places the vertical edge of the resist layer 860 to within a required minimum margin distance 862 from the right edge of STI 850 at the nMOS 830 interface (e.g., to account for possible misalignment). The reduction or loss in the resist in the horizontal dimension to the minimum margin 862 may be tailored as previously indicated. Along with the vertical and horizontal reductions in the resist, the etch process of the present invention, may also be utilized and tailored to cause a corner rounding of the reduced resist layer 860, providing a reduced corner radius 860*r*. These reductions, alone or in combination, minimize the amount of pocket shadowing that will subsequently occur.

Figure 9:
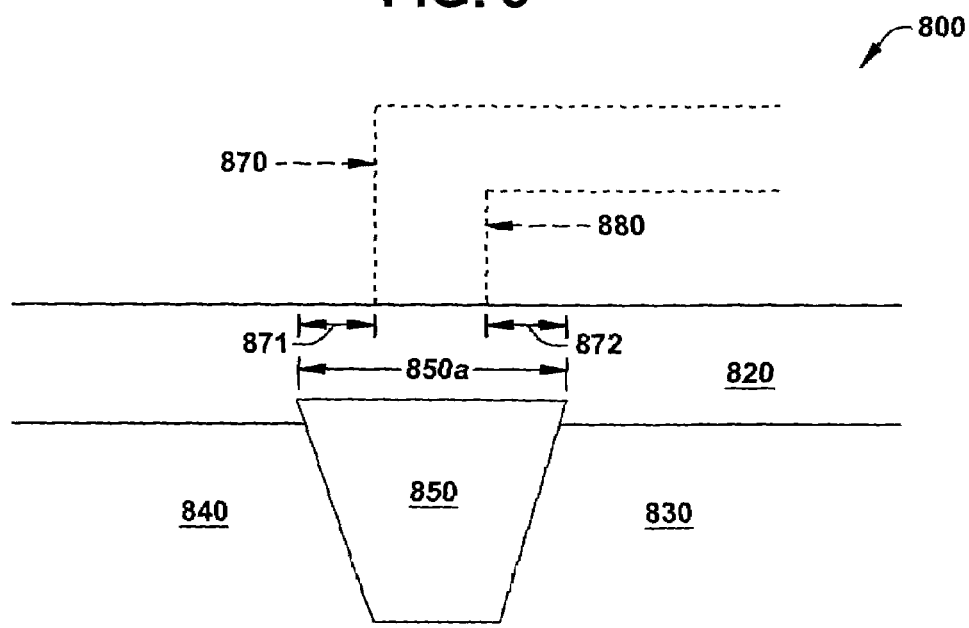

Further, FIG. 9 illustrates other resist placements on the SRAM device 800 of FIG. 8 such as may be used in accordance with the method 700 of FIG. 7. Method 700, having a first and second implant, provides an opportunity for two resist mask pattern placements. In particular, before the first implantation (e.g., vertical, LDD implant) the position of the resist pattern of FIG. 9, may favor a more desirable LDD position 870, having a required LDD margin 871 from the pMOS 840. Then, the resist etch process (e.g., 730) may be utilized to horizontally reposition (by resist loss) the vertical edge of the resist layer to within an optimum required pocket implant margin 872 of the nMOS 830 having reduced resist position 880. The margins discussed relate to the minimum safe distances between the resist edge and the structure that must be covered and protected by the resist from cross diffusion of the dopant species.

In other words, the resist edge at 870 of FIG. 9, must adequately protect the nMOS 830 from the LDD dopant species of the first (vertical) implant, while the resist edge and corner at 880 after the etch process, must adequately allow exposure into the pMOS 840 from the dopant species used in the angled pocket implant of the second implant. Although a first and second implant is discussed in association with the methods and figures of the present invention, it will be appreciated that one or more such implants, including one or more groups of implantations are anticipated in each of the first and second implantations including other vertical, angled or pocket implantations of any of a variety of dopant species.

Figure 10:
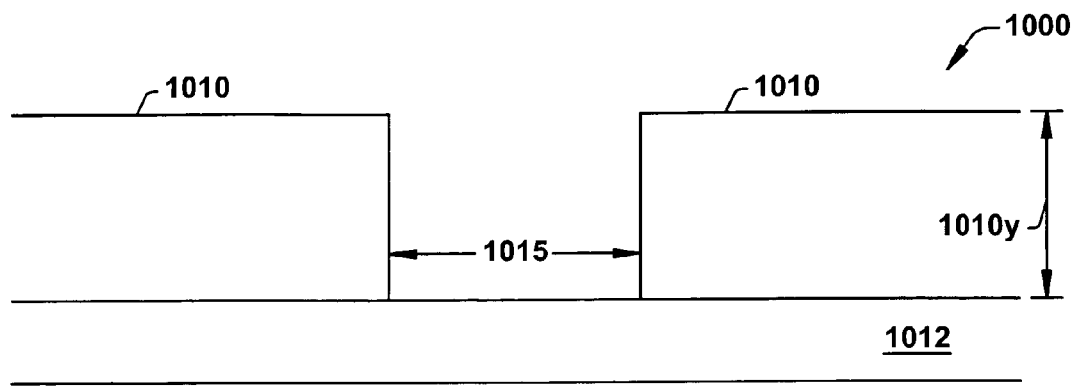
Figure 11:
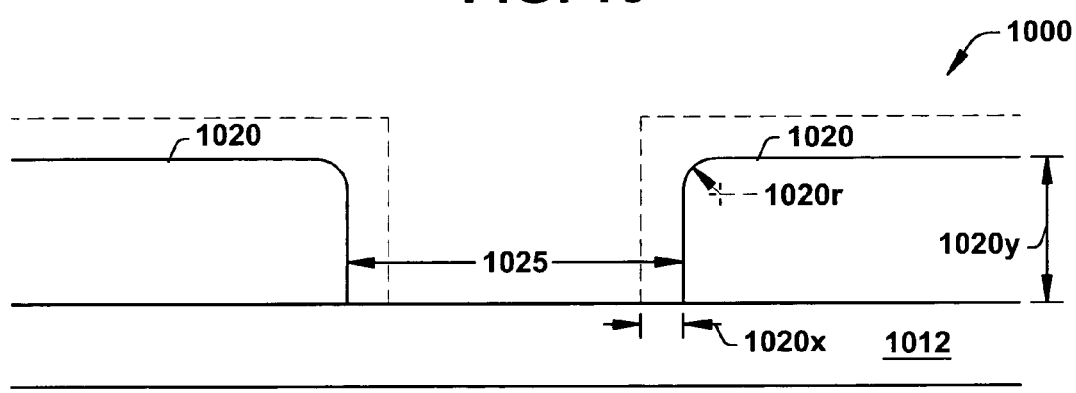
Figure 12:
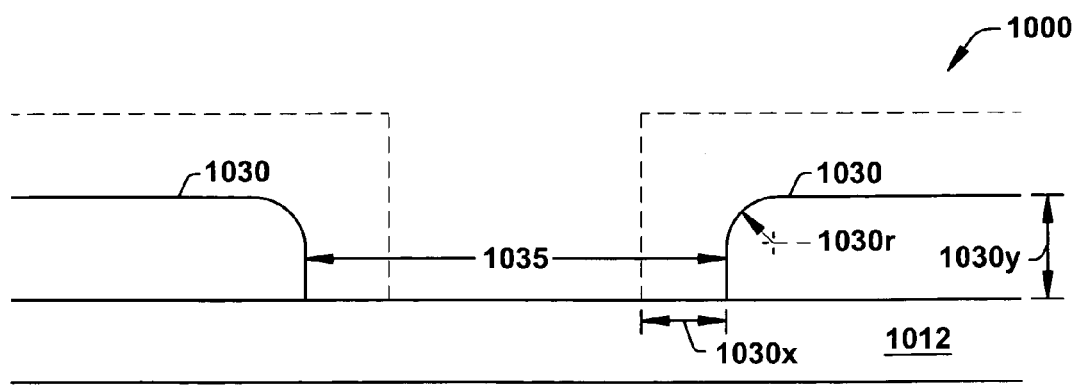

FIGS. 10–12 further illustrate a sequence in the etch process (e.g., 630, 730) for widening the openings within a resist layer having multiple resist edges within a portion of a semiconductor device 1000. In FIG. 10, device 1000 is shown comprising an original resist pattern 1010 overlying a substrate 1012. After pattern development, the resist layer 1010 has an original opening width 1015 with a resist thickness 1010*y*. At this point, the pattern may be used for one or more implants, particularly where vertical implantations are utilized.

FIG. 11 illustrates the device 1000 after resist etching has begun at an intermediate stage of the etch process. The partially reduced resist layer 1020 now has an partially increased opening width 1025 with a reduced resist thickness 1020*y*, and a potential CD reduction 1020*x*. The etch resist layer 1020 also has experienced corner rounding due to etch loss, resulting in an upper corner with radius 1020*r*.

FIG. 12 illustrates the device 1000 after completion of a desired level of resist etching. The reduced final resist layer 1030 now has an increased final opening width 1035 with a final resist thickness 1030*y*, and a potential final CD reduction 1030*x*. The etch resist layer 1030 also has experienced corner rounding due to etch loss, resulting in an upper corner with final radius 1030*r*. Since the CD reduction 1030*x* is seen on both sides of the resist opening, the final opening width 1035 comprises the original opening width 1015 plus two times the final CD reduction 1030*x*.

In this manner, a resist layer provided by a single lithography step may be etched before and/or after an ion implantation to minimize shadowing in a subsequent pocket implantation. Further, the CD of the resist may be optimally designed for the LDD implant, and the resist trim process used to get a different (narrower) CD that is optimal for the pocket implant. That is, in the LDD implant, a resist edge should be closer to the uncovered transistor. This avoids cross diffusion of LDD dopants implanted into the polysilicon and into the polysilicon gate of the covered transistor. For the pocket implant, however, the resist edge is ideally etched closer to the covered transistor to prevent or mitigate pocket shadowing.

It will thus be appreciated that an SRAM incorporating such transistors may be more stable as the transistors are more likely to be balanced or matched when fabricated in accordance with the methods of the present invention.

It will also be appreciated that minimizing shadowing in pocket implantations in accordance with one or more aspects of the present invention may have more application to nMOS transistors, rather than pMOS transistors. This is particularly true where the transistors are incorporated into SRAM since the pMOS devices serve as load transistors within the SRAM, and thus have substantially lower drive current requirements.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In addition, while a particular feature or aspect of the invention may have been disclosed with respect to only one of several implementations, such feature or aspect may be combined with one or more other features or aspects of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, the term "exemplary" is merely meant to mean an example, rather than the best. It is also to be appreciated that layers and/or elements depicted herein are illustrated with particular dimensions relative to one another (e.g., layer to layer dimensions and/or orientations) for purposes of simplicity and ease of understanding, and that actual dimensions of the elements may differ substantially from that illustrated herein. Additionally, the layers can be formed in any number of suitable ways, such as with spin-on techniques, sputtering techniques (e.g., magnetron or ion beam sputtering), (thermal) growth techniques and/or deposition techniques such as chemical vapor deposition (CVD), for example.

What is claimed is:

1. A method of forming a pocket implant extending under a transistor gate region having reduced pocket shadowing in a semiconductor device, comprising:
    forming a resist layer overlying a semiconductor device;
    patterning and developing said resist layer to form a first patterned resist layer comprising a first thickness and a first corner with a first shape;
    forming a second natterned resist layer by trimming the first patterned resist layer using an etch process to reduce said first thickness and form a second corner with a second shape from said first corner wherein said second shape is different from said first shape; and
    implanting one or more dopant species at an angle extending under the gate region of the transistor to form the pocket implant in the semiconductor device using said second patterned resist layer.

2. The method of claim 1, wherein the etch process used to trim the resist layer is one of a wet etch process and a dry etch process used to reduce the thickness of the resist layer.

3. The method of claim 1, wherein the etch process used to trim the resist layer is a combination of a wet etch process and a dry etch process used to reduce the thickness of the resist layer.

4. The method of claim 1, wherein the semiconductor device comprises an SRAM device.

5. The method of claim 1, wherein the transistor is at least one of an nMOS transistor and a pMOS transistor.

6. The method of claim 1, wherein the dopant species implanted at an angle extending under the gate region of the transistor comprises one of an n type and a p type dopant.

7. The method of claim 1, further comprising performing one or more pocket implants after the implanting of the one or more dopant species at an angle extending under the gate region of the transistor to form the pocket implant.

8. A method of forming a pocket implant extending under a transistor gate region having reduced pocket shadowing of angled implants in a semiconductor device, comprising:
    patterning a resist layer overlying the semiconductor device;
    performing a first implant into active regions of the device defined by the patterned resist layer;
    trimming the resist layer using an etch process to reduce a thickness of the resist layer; and
    performing a second angled implant using one or more dopant species after the resist trimming etch.

9. The method of claim 8, wherein the etch process used to trim the resist layer is one of a wet etch process and a dry etch process used to reduce the thickness of the resist layer.

10. The method of claim 8, wherein the etch process used to trim the resist layer is a combination of a wet etch process and a dry etch process used to reduce the thickness of the resist layer.

11. The method of claim 8, wherein the semiconductor device comprises an SRAM device.

12. The method of claim 11, wherein the SRAM device comprises a 6T SRAM.

13. The method of claim 8, wherein the first implant comprises an LDD implant.

14. The method of claim 8, wherein the transistor is one of an nMOS transistor and a pMOS transistor.

15. The method of claim 8, wherein the second implant comprises an angled implant extending under the gate region of the transistor to form the pocket implant.

16. The method of claim 15, wherein the dopant used in the angled implant extending under the gate region of the transistor comprises one of an n type and a p type dopant.

17. The method of claim 8, wherein one of the first and second implants comprises doping a source region or a drain region adjacent the gate region of the transistor.

* * * * *